United States Patent [19]
Sato et al.

[11] Patent Number: 5,740,118
[45] Date of Patent: Apr. 14, 1998

[54] SEMICONDUCTOR MEMORY DEVICE

[75] Inventors: Hajime Sato; Yoshiyuki Ishida, both of Kasugai, Japan

[73] Assignee: Fujitsu Limited, Kanagawa, Japan

[21] Appl. No.: 754,805

[22] Filed: Nov. 21, 1996

[30] Foreign Application Priority Data

Nov. 22, 1995 [JP] Japan ................................. 7-304663

[51] Int. Cl.$^6$ ................................. G11C 13/00
[52] U.S. Cl. ...................... 365/222; 365/229; 365/233
[58] Field of Search ................................. 365/229, 233, 365/189.01, 230.01, 222

[56] References Cited

U.S. PATENT DOCUMENTS 5,463,588 10/1995 Chonan ................................. 365/229

*Primary Examiner*—Terrell W. Fears
*Attorney, Agent, or Firm*—Nikaido, Marmelstein, Murray & Oram LLP

[57] ABSTRACT

A semiconductor memory device is disclosed that reduces a consumed current in a standby mode including a self-refresh mode. In one aspect of the invention, a semiconductor memory device includes a row-system circuit for receiving a first power from a power supply and operable in accordance with a row address strobe signal, a column-system circuit operable in accordance with a column address strobe signal, and a switch circuit that is connected to the column-system circuit. This switch circuit receives the first power from the power supply and supplies the first power to the column-system circuit in an active mode and produces a second power lower than the first power and supplying the second power to the column-system circuit in a standby mode.

10 Claims, 4 Drawing Sheets

5,740,118

1

SEMICONDUCTOR MEMORY DEVICE

BACKGROUND OF THE INVENTION

1. Field of the Invention

The present invention relates to a semiconductor memory device, and, more particularly, to a DRAM (Dynamic Random Access Memory) with a reduced consumed current.

2. Description of the Related Art

Low consumed current is essential for DRAMs which are to be installed on portable and battery-operable small electronic devices. DRAMs store data by storing charges in the capacitors of memory cells. In a standby mode, memory cells are self-refreshed to prevent data stored in the memory cells from being erased. A DRAM has a row-system circuit, which operates in response to a row address strobe signal, and a column-system circuit, which operates in response to a column address strobe signal. Those circuits are connected via a pair of power lines to a high-potential power supply $V_{cc}$ and a low-potential power supply $V_{ss}$ to receive power therefrom.

In the standby mode including a self-refresh mode, however, even when the operations of the row-system and column-system circuits are stopped, a tailing current flows through many transistors which constitute those circuits. The total amount of the tailing current flowing through many transistors becomes significantly large, thus increasing the consumed current of the DRAM. Particularly, the operation of the column-system circuit is completely stopped in the standby mode. Therefore, the standby current of this column-system circuit affects the consumed current.

SUMMARY OF THE INVENTION

Broadly speaking, the present invention relates to a semiconductor memory device which reduces the consumed current in a standby mode including a self-refresh mode.

The present invention can be implemented in numerous ways, including as an apparatus and method.

In one aspect of the invention, a semiconductor memory device includes a row-system circuit for receiving a first power from a power supply and operable in accordance with a row address strobe signal, a column-system circuit operable in accordance with a column address strobe signal, and a switch circuit that is connected to the column-system circuit. This switch circuit receives the first power from the power supply and supplies the first power to the column-system circuit in an active mode and produces a second power lower than the first power and supplying the second power to the column-system circuit in a standby mode.

In another aspect of the invention, the semiconductor memory device further includes a first power line connected between the power supply and the row-system circuit and also connected to the switch circuit, and a second power line connected between the switch circuit and the column-system circuit. The switch circuit includes a self-refresh entry circuit, connected to the first power line, for receiving the row address strobe signal and outputting an entry signal indicative of either the active mode or a self-refresh mode based on the row address strobe signal, and a transistor, connected to the first and second power lines, for permitting supply of the first power to the second power line from the first power line in response to the entry signal indicative of the active mode and for inhibiting supply of the first power and producing the second power in response to the entry signal indicative of the self-refresh mode.

In yet another aspect of the invention, the switch circuit includes an active entry circuit, connected to the first power line, for receiving the row address strobe signal and outputting an entry signal indicative of either the active mode or the standby mode based on the row address strobe signal, a first transistor, connected between the first and second power lines, for permitting supply of the first power to the second power line from the first power line in response to the entry signal indicative of the active mode, and a second transistor, connected between the first and second power lines, for producing the second power lower than the first power in response to the entry signal indicative of the standby mode.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor memory device according to a first embodiment of the present invention will now be described referring to the accompanying drawings.

Figure 1:
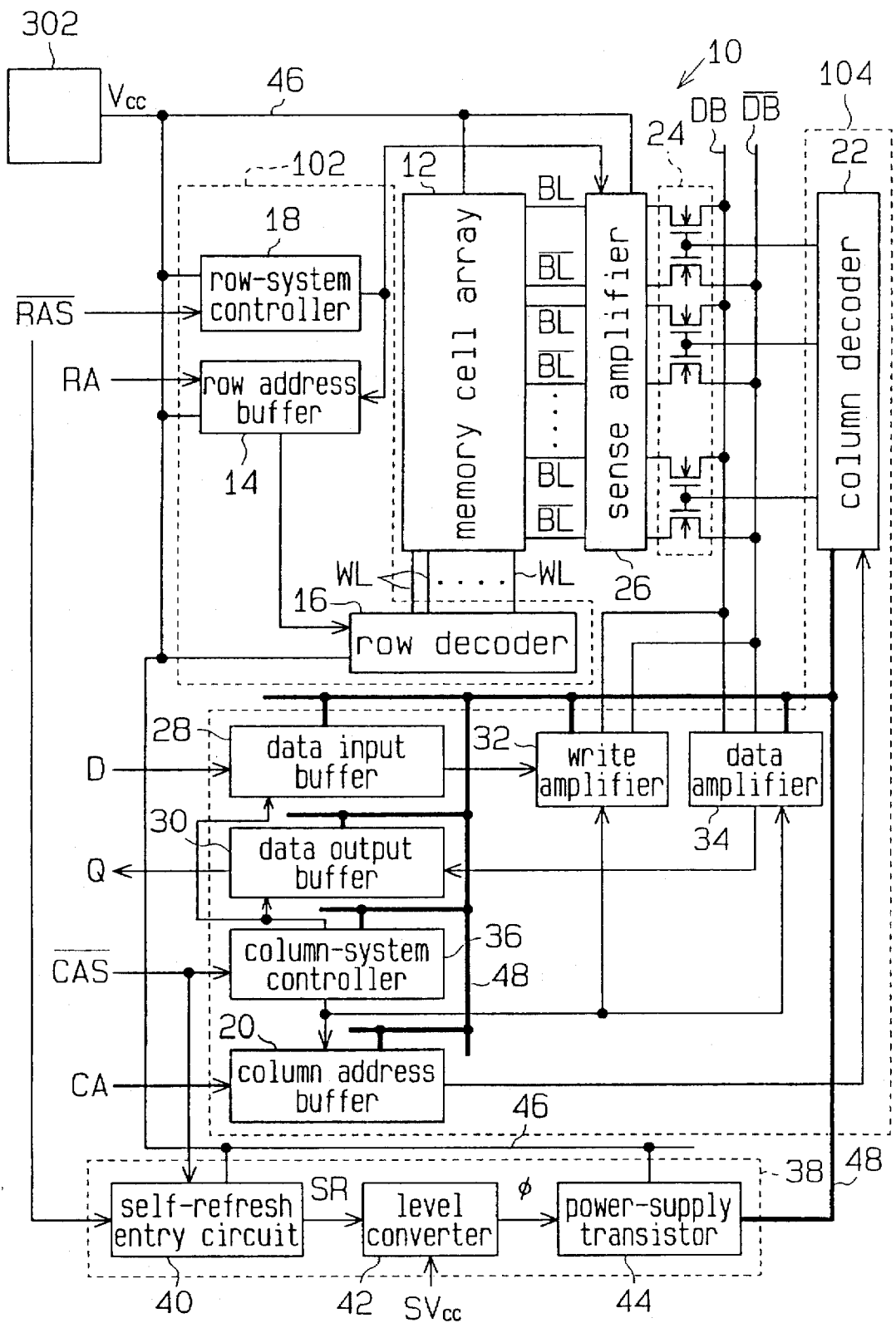
FIG. 1 is a block diagram illustrating a DRAM according to a first embodiment of this invention.

As shown in FIG. 1, a DRAM 10 as a semiconductor memory device receives power from a high-potential power supply $V_{cc}$ and a low-potential (ground) power supply $V_{ss}$ (shown in FIG. 2) as an operational power supply. The DRAM 10 has a memory cell array 12, a row address buffer 14, a row decoder 16, a row-system controller 18, a column address buffer 20, a column decoder 22, a column gate 24, a sense amplifier 26, a data input buffer 28, a data output buffer 30, a write amplifier 32, a data amplifier 34, a column-system controller 36 and a switch circuit 38. The switch circuit 38 includes a self-refresh entry circuit 40, a level converter 42 and a power-supply transistor 44. The memory cell array 12 has a plurality of word lines WL, plural pairs of bit lines BL and /BL, and a plurality of memory cells (not shown) connected to the associated word lines WL and the associated pairs of bit lines BL and /BL. A row-system circuit 102 is formed by the row address buffer 14, the row decoder 16, and the row-system controller 18. A column-system circuit 104 is formed by the column address buffer 20, the column decoder 22, the data input buffer 28, the data output buffer 30, the write amplifier 32, the data amplifier 34 and the column-system controller 36.

The DRAM 10 further has first and second power lines 46 and 48, which are connected together via the power-supply transistor 44. A high-potential supply voltage $V_{cc}$ is supplied to the first power line 46 from a battery 302. The first power line 46 is connected to the memory cell array 12, the row address buffer 14, the row decoder 16, the row-system controller 18, the sense amplifier 26 and the self-refresh entry circuit 40 to supply the high-potential supply voltage $V_{cc}$ to those circuits. The second power line 48 is connected to the column address buffer 20, the column decoder 22, the data input buffer 28, the data output buffer 30, the write amplifier 32, the data amplifier 34 and the column-system controller 36 to supply the high-potential side supply voltage to those circuits.

The row-system controller receives a row address strobe signal/RAS supplied from an external controller (not shown) and supplies control signals to the row address buffer 14 and the sense amplifier 26 in accordance with this signal/RAS. The column-system controller 36 receives a column address strobe signal/CAS supplied from the external controller and sends control signals to the column address buffer 20, the data input buffer 28, the data output buffer 30, the write amplifier 32 and the data amplifier 34 in accordance with this signal/CAS.

The row address buffer 14 receives a row address signal RA from the external controller in response to a control signal from the row-system controller 18 and supplies the row address signal to the row decoder 16. The row decoder 16 decodes the row address signal RA to produce a word select signal indicating that a specific one of the plurality of word lines WL has been selected. The column address buffer 20 receives a column address signal CA from the external controller in response to a control signal from the column-system controller 36 and supplies that column address signal to the column decoder 22. The column decoder 22 decodes the column address signal CA to produce a column select signal indicating that a specific pair of bit lines has been selected from the plural pairs of bit lines BL and/BL. This column select signal is supplied to the column gate 24.

The sense amplifier 26, connected to the plural pairs of bit lines BL and/BL, amplifies data of memory cells which have been read through those bit line pairs BL and/BL. Those pairs of bit lines BL and/BL are connected to a pair of data bus lines DB and/DB via the sense amplifier 26 and the column gate 24. The pair of data bus lines DB and/DB are also connected to the write amplifier 32 and the data amplifier 34.

In a data write mode, the data input buffer 28 receives a data signal D, transferred from an external unit, and supplies the signal D to the write amplifier 32 in response to a control signal from the column-system controller 36. The write amplifier 28 supplies the data signal D, which is to be written in the selected memory cell, onto the pair of data bus lines DB and/DB in response to the control signal from the column-system controller 36.

In a data read mode, the data amplifier 34 receives a data signal read from the selected memory cell via the pair of data bus lines DB and/DB and amplifies the data signal in response to a control signal from the column-system controller 36. The amplified data signal is supplied to the data output buffer 30. The data output buffer 30 outputs a data signal Q in response to a control signal from the column-system controller 36.

Figure 3:
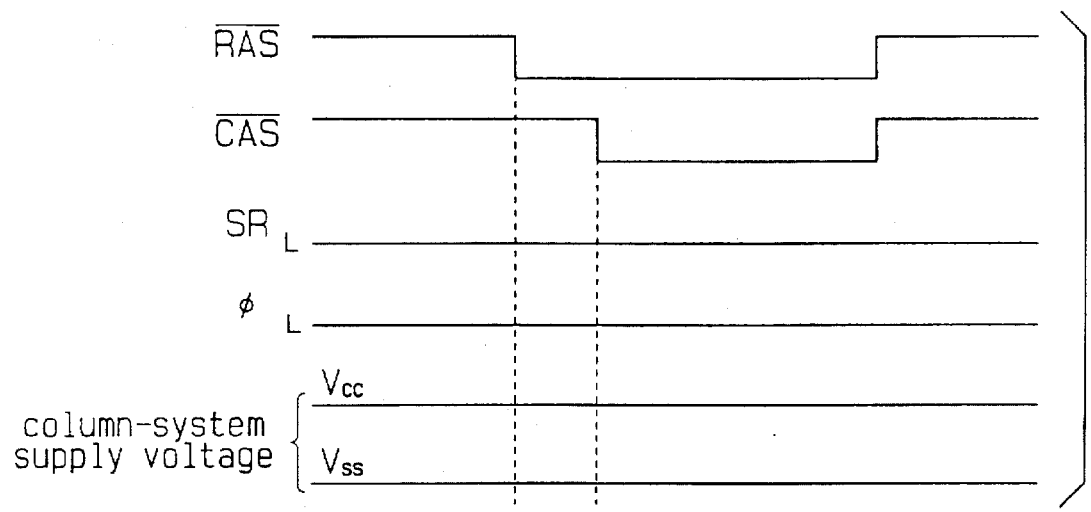
FIG. 3 is a time chart illustrating the operation of a switch circuit in an active mode of the DRAM in FIG. 1.
Figure 4:
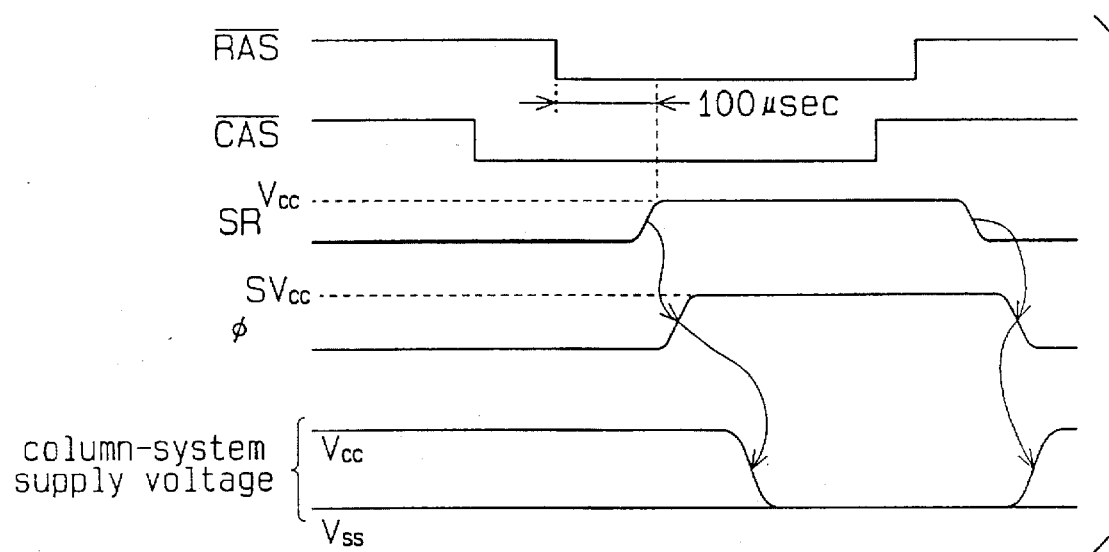
FIG. 4 is a time chart illustrating the operation of the switch circuit in a self-refresh mode of the DRAM in FIG. 1.

The switch circuit 38 selectively switches the high-potential side supply voltage to be supplied to the second power line 48 in accordance with an active mode and a standby mode (self-refresh mode). The self-refresh entry circuit 40 receives the row address strobe signal/RAS and the column address strobe signal/CAS from the external unit, according to which this entry circuit 40 produces an entry signal SR to control the self-refreshing operation. Suppose that the column address strobe signal/CAS falls to the L level after the row address strobe signal/RAS was fallen to the L level, as shown in FIG. 3. With such a signal timing, the self-refresh entry circuit 40 determines that the DRAM 10 is active (in normal operation) for writing or reading data and supplies the entry signal SR having an L-level voltage (the voltage of the power supply $V_{ss}$) to the level converter 42. Assume that the row address strobe signal/RAS falls after the falling of the column address strobe signal/CAS, as shown in FIG. 4. Upon passage of approximately 100 μsec after the falling of the row address strobe signal/RAS, the self-refresh entry circuit 40 determines that the DRAM 10 is in the self-refresh mode and supplies the entry signal SR having an H-level voltage (the voltage of the power supply $V_{cc}$) to the level converter 42. While the row address strobe signal /RAS is holding the L level, the self-refresh entry circuit 40 keeps supplying the H-level entry signal SR.

Figure 2:
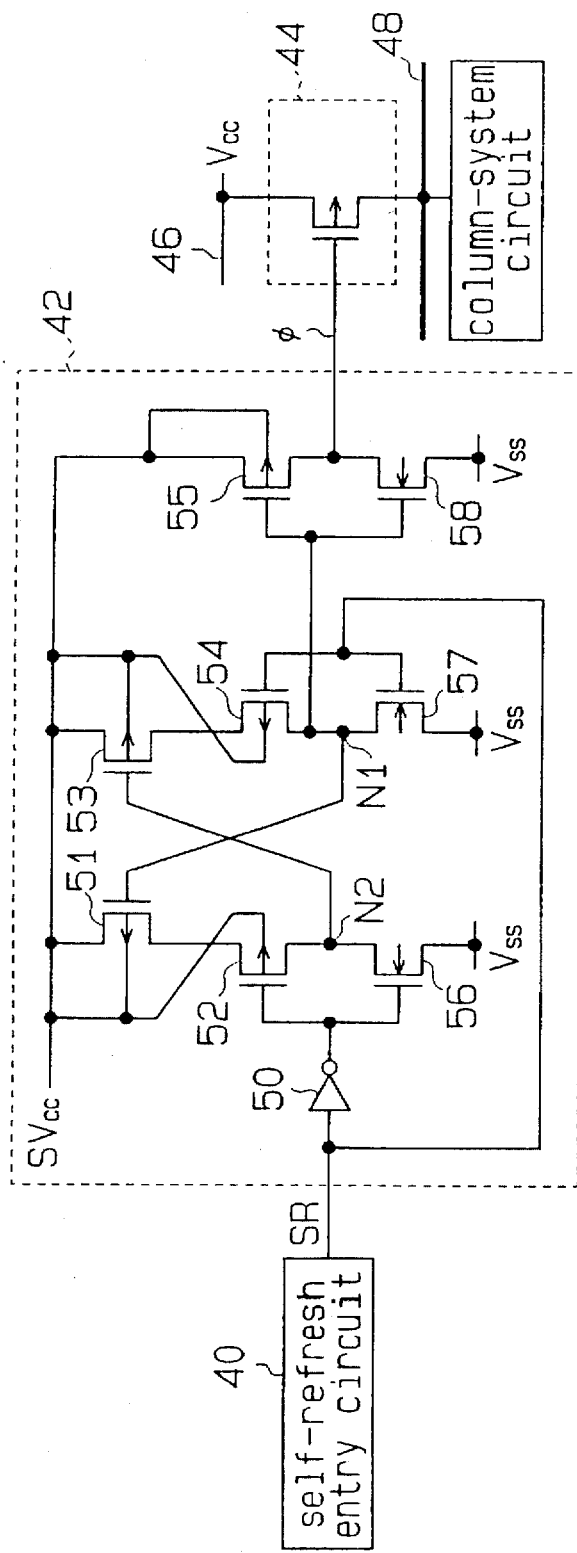
FIG. 2 is a circuit diagram showing a level converter in the DRAM in FIG. 1.

As shown in FIG. 2, the level converter 42 receives both a supply voltage $SV_{cc}$ greater than the supply voltage $V_{cc}$ ($SVcc>Vcc$) and the low-potential supply voltage $V_{ss}$ as operational voltages. The supply voltage $SV_{cc}$ is supplied to the DRAM 10 from an external power supply circuit. The level converter 42 produces a control signal Ø in response to the entry signal SR. This control signal Ø has a level equivalent to the logic amplitude of the entry signal SR, which has been increased within a range from the supply voltage $SV_{cc}$ to the supply voltage $V_{ss}$. The level converter 42 includes five P channel MOS transistors 51 to 55, three N channel MOS transistors 56 to 58 and an inverter 50.

The p-MOS transistors 51 and 52 and the n-MOS transistor 56 are connected in series between the power supply $SV_{cc}$ and the power supply $V_{ss}$. The p-MOS transistor 52 and the n-MOS transistor 56 have gates for receiving a signal, which is the entry signal SR inverted by the inverter 50. The p-MOS transistors 53 and 54 and the n-MOS transistor 57 are likewise connected in series between the power supply $SV_{cc}$ and the power supply $V_{ss}$. The p-MOS transistor 54 and the n-MOS transistor 57 have gates for receiving the entry signal SR. The p-MOS transistor 51 has a gate connected to a node N1 between the p-MOS transistor 54 and the n-MOS transistor 57. The p-MOS transistor 53 has a gate connected to a node N2 between the p-MOS transistor 52 and the n-MOS transistor 56. The p-MOS transistor 55 and the n-MOS transistor 58 are connected in series between the power supply $SV_{cc}$ and the power supply $V_{ss}$. The p-MOS transistor 55 and the n-MOS transistor 58 have gates connected to the node N1 and drains for outputting the control signal Ø.

In response to the L-level entry signal SR, the p-MOS transistor 54 is turned on and the n-MOS transistor 57 is turned off. Consequently, the node N1 has substantially the same voltage level as the supply voltage $SV_{cc}$ or the H level. This turns off the p-MOS transistor 55 and turns on the n-MOS transistor 58. As a result, the control signal Ø has substantially the same voltage level as the supply voltage $V_{ss}$ or the L level.

In response to the H-level entry signal SR, the p-MOS transistor 54 is turned off and the n-MOS transistor 57 is turned on. The node N1 therefore goes to the L level, turning on the p-MOS transistor 55 and turning off the n-MOS transistor 58. As a result, the control signal Ø has the H level. In this manner, the entry signal SR having the voltage level of the supply voltage $V_{cc}$ is converted to the control signal Ø having the voltage level of the supply voltage $SV_{cc}$.

The power-supply transistor 44 is a p-MOS transistor which has a source connected to the power line 46, a drain connected to the power line 48 and a gate for receiving the control signal Ø. In the active mode, the power-supply transistor 44 is turned on to supply the supply voltage $V_{cc}$ to the power line 48 in response to the L-level control signal Ø. In the standby mode including the self-refresh mode, the power-supply transistor 44 is turned off to shut off the supply of the supply voltage $V_{cc}$ in response to the H-level control signal Ø. At this time, the power-supply transistor 44 is completely turned off in response to the control signal Φ, which has the voltage level of the supply voltage $SV_{cc}$ that is greater than the supply voltage $V_{cc}$. This effectively reduces the flow of the tailing current of the power-supply transistor 44.

The operation of the DRAM 10 will now be discussed with reference to FIGS. 3 and 4. When the column address strobe signal/CAS falls after the falling of the row address strobe signal/RAS, as shown in FIG. 3, the DRAM 10 is set to the active mode for data writing or reading.

In the active mode, the self-refresh entry circuit 40 outputs the entry signal SR having the voltage level (L) of the supply voltage $V_{ss}$, and the level converter 42 outputs the control signal Ø having the voltage level (L) of the supply voltage $V_{ss}$. The power-supply transistor 44 is turned on in response to the L-level control signal Ø, causing the high-potential supply voltage $V_{cc}$ to be supplied to the column-system circuit 104 via the power line 48. Accordingly, data is written into or read from the memory cell associated with a specific word line selected according to the row address signal RA and a specific pair of bit lines BL and/BL selected according to the column address signal CA.

When the row address strobe signal/RAS has fallen after the falling of the column address strobe signal/CAS and 100 μsec passes after the falling of the row address strobe signal /RAS, as shown in FIG. 4, the DRAM 10 is set to the self-refresh mode.

In the self-refresh mode, the self-refresh entry circuit 40 outputs the entry signal SR having the voltage level (H) of the supply voltage $V_{ss}$, and the level converter 42 outputs the control signal Ø having the voltage level (H) of the supply voltage $SV_{cc}$. The power-supply transistor 44 is turned off in response to the H-level control signal Ø, inhibiting the supply of the voltage supply $V_{cc}$ to the power line 48. Accordingly, a specific word line is selected through the control of the row address buffer 14 and the row decoder 16 by the row-system controller 18, and a plurality of memory cells connected to the selected word line are refreshed.

In the standby mode including the self-refresh mode, as discussed above, when the power-supply transistor 44 is turned off, the supply of the supply voltage $V_{cc}$ to the power line 48 is shut off. Consequently, the supply voltage supplied to the column-system circuit 104 becomes substantially equal to the low-potential side supply voltage, thus reducing the tailing current that flows through a plurality of transistors in each circuit that constitutes the column-system circuit 104. The standby current is reduced in this manner to suppress an increase in the consumed current of the DRAM 10. Further, the supply of the control signal Ø having the voltage level of the supply voltage $SV_{cc}$ greater than the supply voltage $V_{cc}$ to the gate of the power-supply transistor 44 effectively reduces the tailing current of the power-supply transistor 44.

Figure 5:
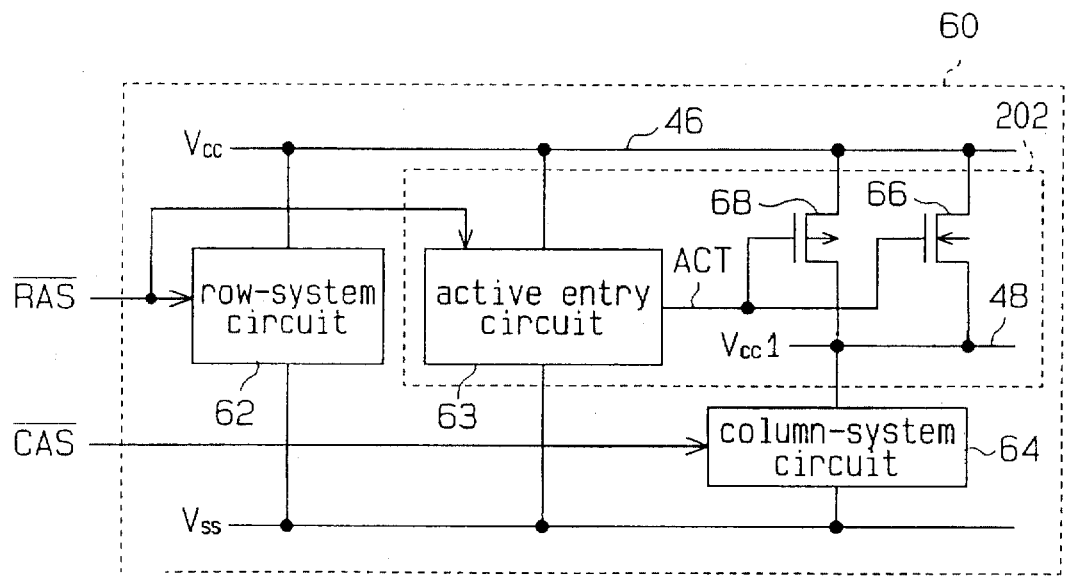
FIG. 5 is a block diagram illustrating a DRAM according to a second embodiment of this invention.
Figure 6:
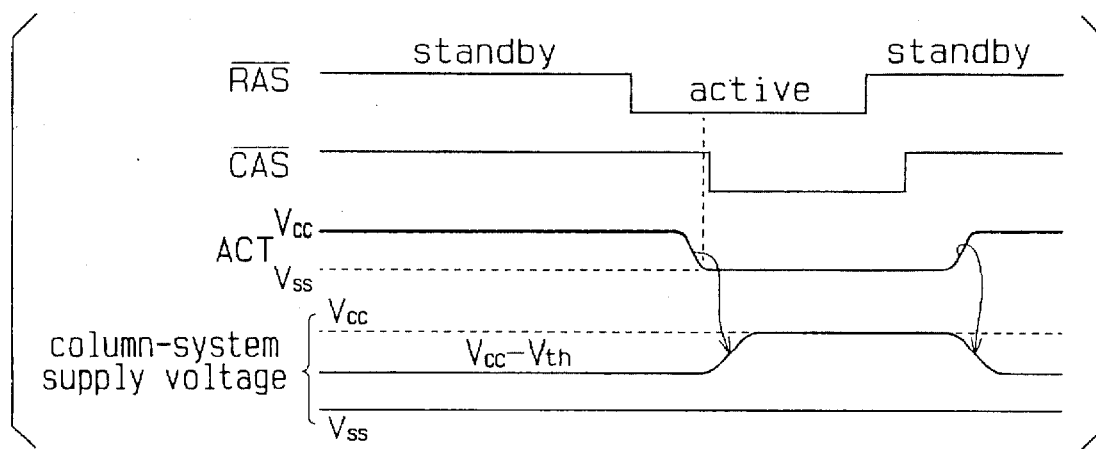
FIG. 6 is a time chart illustrating the operation of the DRAM in FIG. 5.

A semiconductor memory device according to a second embodiment of this invention will be described referring to FIGS. 5 and 6. For the convenience of description, like or same reference numerals are given to those components which are the same as the corresponding components of the first embodiment in FIG. 1. As shown in FIG. 5, a DRAM 60 receives power from a high-potential power supply $V_{cc}$ and a low-potential (ground) power supply $V_{ss}$ (shown in FIG. 2) as an operational power supply. The DRAM 60 has a row-system circuit 62, a column-system circuit 64, an active entry circuit 63, a power-supply n-MOS transistor 66 and a power-supply p-MOS transistor 68. In the second embodiment, the active entry circuit 63, n-MOS transistor 66 and the p-MOS transistor 68 form a switch circuit 202. In accordance with the row address strobe signal/RAS, the active entry circuit 63 outputs an L-level active entry signal ACT in the active mode and outputs an H-level active entry signal ACT in the standby mode (self-refresh mode).

The first power line 46 is connected to the row-system circuit 62 and the active entry circuit 63 to supply the high-potential supply voltage $V_{cc}$ to those circuits. The second power line 48 is connected to the column-system circuit 64 to supply the high-potential side supply voltage to this circuit.

The power-supply n-MOS transistor 66 has a drain connected to the power line 46, a source connected to the power line 48 and a gate for receiving the active entry signal ACT. The power-supply p-MOS transistor 68 has a source connected to the power line 46, a drain connected to the power line 48 and a gate for receiving the active entry signal ACT.

In the active mode, the power-supply p-MOS transistor 68 is turned on in response to the L-level active entry signal ACT, thus permitting the supply voltage $V_{cc}$ to be supplied to the power line 48.

In the standby mode, the power-supply n-MOS transistor 66 is turned on in response to the H-level active entry signal ACT, thus permitting the supply voltages, which is lower than the supply voltage $V_{cc}$ by the threshold voltage $V_{th}$ of the transistor 66, to be supplied to the power line 48.

According to the second embodiment, as apparent from the above, the supply voltage, which is lower than the supply voltage $V_{cc}$ by the threshold voltage $V_{th}$ of the transistor 66, is supplied to the power line 48 in the standby mode. Therefore, the potential difference between the high-potential side supply voltage to be supplied to the column-system circuit 64 in the standby mode and the low-potential supply voltage $V_{ss}$ becomes smaller than the potential difference in the active mode. In other words, the high-potential supply voltage to be supplied in the standby mode is lower than the high-potential supply voltage $V_{cc}$ in the active mode. As a result, the tailing current that flows through multiple transistors constituting the column-system circuit 64, i.e., the standby current, is reduced to suppress an increase in the consumed current of the DRAM 60.

Although only two embodiments of the present invention have been described herein, it should be apparent to those skilled in the art that the present invention may be embodied in many other specific forms without departing from the spirit or scope of the invention. Particularly, it should be understood that the invention may be embodied in the following form.

A booster circuit, which receives power from the power supply $V_{cc}$ and generates the supply voltage $SV_{cc}$ higher than the supply voltage $V_{cc}$, may be provided in the DRAM 10.

Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:

a row-system circuit for receiving a first power from a power supply and operable in accordance with a row address strobe signal;

a column-system circuit operable in accordance with a column address strobe signal; and a switch circuit, connected to said column-system circuit, for receiving said first power from said power supply and supplying said first power to said column-system circuit in an active mode and for shutting of the supply of the first power to said column-system circuit in a standby mode.

2. The semiconductor memory device according to claim 1, further comprising:

a first power line connected between said power supply and said row-system circuit and also connected to said switch circuit; and a second power line connected between said switch circuit and said column-system circuit.

3. The semiconductor memory device according to claim 1, wherein said first power has a high potential and said second power has a ground potential.

4. The semiconductor memory device according to claim 2, wherein said switch circuit includes:

a self-refresh entry circuit, connected to said first power line, for receiving said row address strobe signal and outputting an entry signal indicative of either said active mode or a self-refresh mode based on said row address strobe signal; and a transistor, connected to said first and second power lines, for permitting supply of said first power to said second power line from said first power line in response to said entry signal indicative of said active mode and for inhibiting supply of said first power and producing said second power in response to said entry signal indicative of said self-refresh mode.

5. The semiconductor memory device according to claim 4, wherein said transistor is a P channel MOS transistor.

6. The semiconductor memory device according to claim 4, wherein said switch circuit includes a level converter, connected between said self-refresh entry circuit and said transistor, for receiving said entry signal indicative of said self-refresh mode and converting a level of said received entry signal to a voltage level higher than that of said first power.

7. A semiconductor memory device comprising:

a row-system circuit for receiving a first power from a power supply and operable in accordance with a row address strobe signal;

a column-system circuit operable in accordance with a column address strobe signal;

a switch circuit, connected to said column-system circuit, for receiving said first power from said power supply and supplying said first power to said column-system circuit in an active mode and for producing a second power lower than said first power and supplying said second power to said column-system circuit in a standby mode;

a first power line connected between said power supply and said row-system circuit and also connected to said switch circuit; and a second power line connected between said switch circuit and said column-system circuit, wherein said switch circuit includes an active entry circuit, connected to said first power line, for receiving said row address strobe signal and outputting an entry signal indicative of either said active mode or said standby mode based on said row address strobe signal, a first transistor, connected between said first and second power lines, for permitting supply of said first power to said second power line from said first power line in response to said entry signal indicative of said active mode, and a second transistor, connected between said first and second power lines, for producing said second power lower than said first power in response to said entry signal indicative of said standby mode.

8. The semiconductor memory device according to claim 7, wherein said first transistor is a P channel MOS transistor and said second transistor is an N channel MOS transistor.

9. The semiconductor memory device according to claim 7, wherein said first power has a high potential and said second power has a potential lower than said high potential by a threshold value of said second transistor.

10. A semiconductor memory device comprising:

a row-system circuit receiving a power via a power supply line and operating in response to a row address strobe signal;

a column-system circuit operating in response to a column address strobe signal; and a switch circuit connected between said power supply line and a power source node of said column-system circuit, the switch circuit turning on during a normal mode to supply said power to said column-system circuit and the switch circuit turning off during a refresh mode to shut off the supply of power to said column-system circuit.

* * * * *